(12) United States Patent
Tsukada

(10) Patent No.: US 7,349,275 B2
(45) Date of Patent: Mar. 25, 2008

(54) SEMICONDUCTOR MEMORY

(75) Inventor: Shuichi Tsukada, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/586,518

(22) Filed: Oct. 26, 2006

(65) Prior Publication Data
US 2007/0097769 A1 May 3, 2007

(30) Foreign Application Priority Data
Oct. 28, 2005 (JP) ............................. 2005-314602
Aug. 7, 2006 (JP) ............................. 2006-214635

(51) Int. Cl.
*G11C 7/00* (2006.01)
(52) U.S. Cl. ...................... 365/205; 365/203; 365/149
(58) Field of Classification Search ................ 365/205, 365/207, 203, 204, 149, 189.09, 189.11
See application file for complete search history.

(56) References Cited

U.S. PATENT DOCUMENTS

| | | | |
|---|---|---|---|
| 5,703,819 A * | 12/1997 | Gotoh | ........................ 365/203 |
| 6,392,944 B1 | 5/2002 | Kono | |
| 6,519,198 B2 * | 2/2003 | Suematsu et al. | ............ 365/205 |
| 6,754,122 B2 * | 6/2004 | Wada et al. | ................. 365/207 |
| 6,762,968 B2 * | 7/2004 | Suematsu et al. | ............ 365/205 |

FOREIGN PATENT DOCUMENTS

JP 2002-230975 A 8/2002

* cited by examiner

*Primary Examiner*—Gene N. Auduong
(74) *Attorney, Agent, or Firm*—Foley & Lardner LLP

(57) ABSTRACT

A system in which an overdrive period in a DRAM may be provided without providing for accurate delay time. There are provided MOS transistor TP1, capacitor C1, MOS transistor TP2, and control circuit. MOS transistor TP1 is turned on when overdriving begins, and is designed to supply voltage of power supply VDD1 to parallel-connected sense amplifiers. Capacitor C1 accumulates electrical charges referenced to in association with electrical charges supplied to sense the amplifiers via MOS transistor TP1. MOS transistor TP2 is turned on when overdriving begins, to supply voltage of power supply VDD1 to capacitor C1. The control circuit controls so that MOS transistors TP1, TP2 are turned off when the capacitor potential has reached voltage VREF1. There is also provided a MOS transistor turned on after the MOS transistors TP1, TP2 are turned off to supply a power supply voltage equal to the voltage VREF1 to the plural sense amplifiers.

18 Claims, 16 Drawing Sheets

SEMICONDUCTOR MEMORY

FIELD OF THE INVENTION

This invention relates to a semiconductor memory and, more particularly, to a semiconductor memory including sense amplifiers based on an overdrive system. This invention claims Convention priorities based on earlier Japanese Patent Application No. 2005-314602 of Oct. 28, 2005 and No. 2006-214635 of Aug. 07, 2006.

BACKGROUND OF THE INVENTION

As the integration degree of the semiconductor memories becomes higher, problems are raised in connection with lowering of breakdown voltage of semiconductor devices, attendant on miniaturization, and also in connection with increasing current consumption. For combating the problem, attempts are being made to lower the power supply voltage. In a DRAM (Dynamic Random-Access Memories), it is felt to be necessary to lower the array voltage in order to cope with the lowered breakdown voltage of the elements making up the memory cells, such as capacitors.

However, the lowering of the array voltage is retrogressive from the viewpoint of raising the speed of the sensing operation and hence poses a problem. As a countermeasure, a so-called overdrive system has been developed, in which the memory cell array is driven at a high voltage only during an initial period of the sensing operation.

FIG. 13 is a circuit diagram showing essential portions of a DRAM having typical conventional sense amplifier of the overdrive system. The array of the state-of-the-art DRAM is made up of units termed banks, each of which is made up of a plural number of sub-arrays A, B, . . . , each including the same number of sense amplifiers and the same number of memory cells. FIG. 13 shows one of such banks. The sub-array A of the bank shown includes an overdrive circuit 1, a Pch transistor TP3, a plural number of sense amplifiers SA and an Nch transistor TN1.

A node SAP, operating as a positive power supply of the sense amplifier SA, is driven by the overdrive circuit 1 and by a Pch transistor TP3. The overdrive circuit 1 is controlled by a control signal SEP1, while the Pch transistor TP3 is driven by an array voltage VARY, and has its gate supplied with a control signal SEP2. A node SAN, operating as the ground for the sense amplifiers SA, is driven by an Nch transistor TN1, to the gate of which is transmitted a control signal SEN. The sense amplifier SA is made up of two Pch transistors and two Nch transistors, and actuates bitlines BLT, BLN. There are bitline capacitances Cd, parasitic on the bitlines BLT, BLN, respectively.

To the overdrive circuits 1 of the sub-arrays A, B, . . . , a power supply VDD is supplied as power supply. It is noted that a wiring resistance R is parasitic on the wiring from a pad of the power supply VDD to the overdrive circuit 1, and a power supply VDD1 is transmitted via wiring resistance R to the overdrive circuit 1. The resistance value of the wiring resistance R differs from one bank to another by such factors as varying distances from the pad.

FIG. 14 depicts a circuit diagram showing the constitution of the conventional overdrive circuit 1 used in FIG. 13. The conventional overdrive circuit 1 includes a Pch transistor TP100, having a source and a drain connected to a power supply VDD1 and to a node SAP and having a gate supplied with a control signal SEP1.

FIG. 15 depicts a timing chart showing the operation of the circuits shown in FIGS. 13 and 14. It is assumed that, out of the plural sub-arrays, only the sub-array A is activated to perform the sensing operation. In FIG. 15, the levels of the control signals SEP1, SEP2 and SEN and voltage waveforms of the power supply VDD1, nodes SAP and SAN and the bitlines BLT, BLN, are indicated by solid lines.

Before timing T1, the potentials of the nodes SAP and SAN and the bitlines BLT, BLN are set to one-half of the array voltage VARY (0.5×VARY), and wordlines, not shown, are activated to read out the memory cell information. There is generated an extremely small differential potential between the bitlines BLT and BLN.

At a timing T1, the control signal SEP1 goes LOW (VSS) from HIGH (VDD). This turns the Pch transistor PT100 on so that the node SAP is driven towards the power supply VDD1. This generates a current flow from the power supply VDD so that the potential of the power supply VDD1 is transiently lowered by the wiring resistance R. On the other hand, the control signal SEN is changed from LOW to HIGH at timing T1. This turns the Nch transistor TN1 on so that the node SAN is driven towards the voltage VSS (ground). Since the nodes SAP and SAN are driven, the sense amplifier SA is activated, so that the bitlines BLT and BLN become HIGH and LOW, respectively, to commence the sensing operation.

At timing T3, the potential of the bitline BLT has risen to the potential of the array voltage VARY. At timing T3, the control signals SEP1 and SEP2 are set to HIGH and LOW levels, respectively. This turns the Pch transistor TP100 and the Pch transistor TP3 off and on, respectively, and hence the node SAP is driven by the array voltage VARY.

The time period from timing T1 to timing T3 is termed an overdrive period. During this time period, the sense amplifiers SA is driven by a high voltage, which is the power supply VDD, so that, even if the array voltage VARY is a lower voltage, the sense operation can be carried out at a higher speed.

On the other hand, the overdrive circuit 1 supplies a large amount of electrical charges to the node SAP during the overdrive period. The reason the large amount of electrical charges is supplied is that the sub-array A includes a large number of sense amplifiers SA, and that the capacitance Cd of the bitlines, sensed to the high level side, has to be set to a value VARY from 0.5×VARY. With the number N of the sense amplifiers SA of the sub-array, the total load capacitance CD=N×Cd. The electrical charges QD, supplied to the node SAP, may be represented by the following equation (1):

$$QD = CD \times 0.5 \times VARY \quad (1)$$

It is seen from FIG. 15 that, since the large amount of the electrical charges flows through the wiring resistance R1, the voltage of the power supply VDD1 sags from the power supply VDD by voltage drop during the overdrive period.

As a related technology, a semiconductor memory, in which high-speed sense amplifier operation for coping with the use of a lower voltage and improved reliability of the memory cell capacitors may be achieved in combination, is shown in Patent Document 1.

[Patent Document 1]

Japanese Patent Kokai Publication No. JP-P2002-230975A, the disclosure thereof being incorporated herein by reference thereto.

This disclosure maybe also referred to upon needs in the present invention when analyzing the nature of operation as set forth below.

SUMMARY OF THE DISCLOSURE

Meanwhile, it is desirable to set the end timing of the overdrive period, as accurately as possible, to the timing when the potential of the bitline BLT reaches the potential of the array voltage VARY.

In FIG. 15, the waveforms of the bitline BLT, node SAP and the voltage of the power supply VDD1 in case the end timing of the overdrive period, that is, the timing when the control signal SEP1 changes to the HIGH level and the control signal SEP2 changes to the LOW level, is delayed from the timing T3, are shown with broken lines by BLT', SAP' and VDD1', respectively. The potential on the bitline BLT becomes higher than the array potential VARY. If the overdrive period comes to a close in this state, that is, at a time point somewhere later than the timing T3, the voltage higher than the array potential VARY is applied to the capacitor of the memory cell, and hence the problem related with breakdown voltage arises. In addition, the electrical charges stored on the bitline BLT, where the voltage has been increased excessively, are discarded through the array potential VARY, thus raising the problem of wasteful current consumption.

If, on the contrary, the end timing of the overdrive period is temporally ahead of the timing T3, the potential on the bitline BLT has not reached the array voltage VARY. Hence, the sense operation needs to be continued with the lower voltage value of the array voltage VARY to raise the potential on the bitline BLT to the array voltage VARY, thus slowing down the sensing speed.

As described above, the setting of the timing T3 is crucial for an optimum sensing operation. This timing T3 is usually set as a delay time from the timing T1 with the use of a delay circuit constructed by multi-staged series connection of inverters, for example. However, due to various factors, specified by (1) to (6) below, it is difficult to accurately set the overdrive period beginning from timing T1 and continuing to timing T3.

(1) VDD voltage variations. FIG. 16 shows voltage to current characteristics of a routine Pch transistor. The Pch transistor TP100 of FIG. 14 also has these characteristics. It is noted that VDS, VGS and IDS of the Pch transistor are all of negative values and hence are designated by absolute values.

After timing T1, the control signal SEP1 becomes LOW (VSS). If the voltage VDD is high, the gate-to-source voltage |VGS| of the Pch transistor TP100 is of characteristics |VGS1| in FIG. 16, because VDD1-VSS becomes higher. The drain current |IDS| becomes a high current so that the potential of the bitline BLT is quickly changed to the potential of the array voltage VARY. The desired timing T3 becomes earlier.

If conversely the voltage VDD is low, the gate-to-source voltage |VGS| of the Pch transistor TP100 is of characteristics of |VGS2|, because VDD1-VSS becomes lower. The drain current |IDS| becomes a low current and hence the time until the potential of the bitline BLT is raised to the potential of the array voltage VARY is protracted. Hence, the desired timing T3 is delayed.

With the desired timing T3, described above, it is difficult to match the delay timing of the delay circuit for the entire range of the VDD voltage.

(2) Process-related variations in transistor characteristics. The characteristics of the Pch transistor TP100 of FIG. 14 or the transistors of the delay circuit are varied due to manufacture tolerances. By these variations, the desired timing T3 is changed, as is the delay time of the delay circuit. It is difficult to afford the same variations as the changes of the desired timing T3 to the delay time of the delay circuit.

(3) Variations in temperature. The characteristics of the Pch transistor TP100 of FIG. 14 or the transistors of the delay circuit are further varied due to temperature variations. By these variations, the desired timing T3 is changed, as is the delay time of the delay circuit. It is difficult to afford the same variations as the changes of the desired timing T3 to the delay time of the delay circuit.

(4) Wiring resistance dependency of the power supply VDD. Since the distance of the respective banks from the pad of the power supply VDD is variable, it is difficult to match the wiring resistance R for the entire banks. With differing values of the wiring resistance R, the sagging of the voltage of the power supply VDD1 differs from bank to bank, as a result of which the current through the Pch transistor TP100 as well as the desired timing T3 differs from bank to bank. It would be cumbersome to set different values of the delay time of the delay circuit from one bank to another.

(5) Dependency on the number of activated sub-arrays. In DRAMs of these days, only a smaller number of sub-arrays are activated for read/write in order to decrease the current consumption. Conversely, for refresh, a larger number of sub-arrays are activated in order to reduce the number of refresh cycles per unit time. For example, in FIG. 13, the unit of activation for write/read is only one sub-array. The electrical charges flowing through the wiring resistance R at this time is 1×QD. During refresh, on the other hand, two sub-arrays, for example, are activated simultaneously, so that the amount of electrical charges flowing through the wiring resistance R is 2×QD. As a result, the magnitude of voltage sagging of VDD1 for write/readout differs from that for refresh, and hence the desired timing T3 also differs. It would be cumbersome to set the values of the delay time of the delay circuit distinctly for write/readout and for refresh.

(6) Process-related variations of the bitline capacitance Cd. The bitline capacitance Cd is also changed due to manufacture tolerances. By these variations, the desired timing T3 is changed. However, the delay time of the delay circuit is usually not affected by manufacture tolerances of the bitline capacitance Cd, so that it becomes difficult to match the delay time.

Accordingly, there is much to be desired in the art.

According to a first aspect of the present invention, there is provided a semiconductor memory which includes a plurality of sense amplifiers based on an overdrive system. Specifically, the semiconductor memory comprises a first switch device interconnecting the sense amplifiers, connected in parallel to one another, and a first power supply. The first switch device is on when overdrive begins. The semiconductor memory also includes a capacitive device that accumulates electrical charges referenced to in association with electrical charges supplied via the first switch device to the sense amplifiers, and a second switch device interconnecting the capacitive device and the first power supply and being turned on when overdrive begins. The semiconductor memory also includes a control circuit that exercises control for turning the first and second switch devices off when the potential of the capacitive device has reached a preset voltage lower than a voltage of the first power supply. The semiconductor memory also includes a third switch device interconnecting the sense amplifiers and a second power supply having the preset voltage. The third switch device is turned on after the first and second switch devices are turned off to supply the second power supply to the sense amplifiers.

A semiconductor memory in a second aspect of the present invention includes a plurality of sense amplifiers of an overdrive system. More specifically, the semiconductor memory includes a first capacitive device charged to a potential of a third power supply, during the time outside an overdrive period, and a first switch device turned on during the overdrive period for supplying the electrical charges stored in the first capacitive device to a plurality of sense amplifiers connected in parallel with one another. The semiconductor memory also includes a second switch device turned on when the overdrive period ends to supply a second power supply having a potential lower than the potential of the third power supply to the plural sense amplifiers. The capacitance of the first capacitive device is determined based on a total load capacitance driven with the first switch device on, the potential of the third power supply and the potential of the second power supply.

The meritorious effects of the present invention are summarized as follows.

According to the present invention, the electrical charges supplied to the sense amplifier during the overdrive period may be controlled accurately, and hence the bitline potential following the overdrive period may precisely be set to the desired array voltage. That is, the overdrive period may be set without providing for accurate delay time.

According to the first aspect of the present invention, the following preferred modes are possible.

The first and second switch devices comprises a first MOS transistor and a second MOS transistor, respectively; a size ratio between the first and second MOS transistors being determined based on a ratio of a total load capacitance to be driven with the first MOS transistor on and a capacitance of the capacitive device.

The second MOS transistor is made up of a plurality of MOS transistors which are connected parallel to one another and are controlled on or off, respectively; and the effective size of the second MOS transistor is set by on/off control of a plurality of MOS transistors.

The first MOS transistor has a function of setting an effective size of the first MOS transistor based on a control signal.

The capacitive device has a function of setting the effective capacitance value thereof by a control signal.

The semiconductor memory may further comprise:
a third MOS transistor connected between the second MOS transistor and the capacitive device;
the third MOS transistor having a source connected to the drain of the second MOS transistor, having a drain connected to the capacitive device and having a gate supplied with a correction voltage.

The correction voltage may be one-half the preset voltage.

The semiconductor memory may further comprise:
a differential amplifier having a non-inverting input terminal connected to a junction node interconnecting the drain of the first MOS transistor and the sense amplifiers and having an inverting input terminal connected to a junction node interconnecting the drain of the second MOS transistor and the source of the third MOS transistor; wherein an output terminal of the differential amplifier is connected to the gate of the third MOS transistor instead of applying the correction voltage to the gate of the third MOS transistor.

The semiconductor memory may further comprise:
a fourth MOS transistor having a source connected to a junction interconnecting the drain of the first MOS transistor and the sense amplifiers and having a gate and a drain connected together; and a circuit composed of a series connection of an impedance device and a fourth switch device;
the circuit having one end connected to a junction interconnecting the gate and the drain of the fourth MOS transistor; the circuit having the other end grounded;
the fourth switch device being on during an overdrive period;
a junction interconnecting the gate and the drain of the fourth MOS transistor being connected to the gate of the third MOS transistor instead of applying the correction voltage to the gate of the third MOS transistor.

According to the second aspect of the present invention, the following preferred modes are possible.

The capacitive device may be made up by a circuit composed of a parallel connection of a plurality of cascaded connections each including a MOS transistor that may be turned on or off and a capacitor; and the effective capacitance of the first capacitive device is determined by on/off control of the MOS transistor.

The semiconductor memory may further comprise:
a third switch device interconnecting a first power supply and the third power supply and being turned on when overdriving begins;

a second capacitive device that accumulates electrical charges referenced to in association with electrical charges supplied via the third switch device and the first switch device to the plural sense amplifiers;

a fourth switch device interconnecting the second capacitive device and the first power supply and being turned on when overdriving begins; and a control circuit that exercises control so that, when a potential of the second capacitive device has reached a potential of the second power supply, the third and fourth switch devices are turned off.

The third and fourth switch devices may comprise a first MOS transistor and a second MOS transistor, respectively; and a size ratio between the first and second MOS transistors is determined based on a ratio between a total load capacitance driven with the first MOS transistor on and a capacitance of the second capacitive device.

The second MOS transistor may be made up of a plurality of MOS transistors which are connected in parallel with one another and are controlled to be turned on or off, respectively;

an effective size of the second MOS transistor being set by on/off control of the plural MOS transistors.

The semiconductor memory may further comprise:
a third MOS transistor connected between the second MOS transistor and the second capacitive device;
the third MOS transistor having a source connected to the drain of the second MOS transistor, having a drain connected to the second capacitive device and having a gate supplied with a correction voltage.

The correction voltage may be one-half the preset voltage.

The semiconductor memory may further comprise:
a differential amplifier having a non-inverting input terminal connected to a junction point interconnecting the drain of the first MOS transistor and the third power supply and having an inverting input terminal connected to a junction point interconnecting the drain of the second MOS transistor and the source of the third MOS transistor; wherein an output terminal of the differential amplifier is connected to the gate of the third MOS transistor instead of applying the correction voltage to the gate of the third MOS transistor.

The semiconductor memory may further comprise:

a fourth MOS transistor having a source connected to a junction interconnecting the drain of the first MOS transistor and the third power supply and having a gate and a drain connected together; and a circuit composed of a series connection of an impedance device and a fifth MOS transistor;

the circuit having one end connected to a junction interconnecting the gate and the drain of the fourth MOS transistor; the circuit having the other end grounded;

the fifth MOS switch being on during an overdrive period;

a junction interconnecting the gate and the drain of the fourth MOS transistor being connected to the gate of the third MOS transistor, instead of applying the correction voltage to the gate of the third MOS transistor.

PREFERRED EMBODIMENTS OF THE INVENTION

A semiconductor memory includes a plurality of sense amplifiers based on the overdrive system. Specifically, the semiconductor memory includes a first MOS transistor (TP1 of FIG. 1) supplying a preset power supply (VDD1 of FIG. 1) to a plural number of parallel-connected sense amplifiers (SA of FIG. 1), and a capacitor (C1 of FIG. 1) for accumulating electrical charges referenced (for comparison) to in association with electrical charges supplied via the first MOS transistor to the sense amplifiers. The semiconductor memory also includes a second MOS transistor (TP2 of FIG. 1) turned on when overdrive begins in order to supply a preset power supply (VDD1 of FIG. 1) to the capacitor, and a control circuit for exercising control for turning the first and second MOS transistors off when the potential of the capacitive device has reached a preset voltage (VREF1 of FIG. 1). The semiconductor memory further includes a third MOS transistor (TP3 of FIG. 13) turned on after the first and second MOS transistors are turned off to supply the preset voltage (VARY of FIG. 13 equal to VREF1 of FIG. 1) to the sense amplifiers.

In the above configuration, the size ratio between the first and second MOS transistors is set based on a ratio between the total load capacitance driven with the first MOS transistor on and a capacitance of the capacitor. In this case, the second MOS transistor may be constituted by a plural number of MOS transistors controlled to be turned on or off and which are connected in parallel with one another. The effective size of the second MOS transistor may be set by on/off control of the plural MOS transistors. By setting the size of the second transistor in this manner, it is possible to control precisely the amount of electrical charges supplied to the sense amplifiers, with the first MOS transistor being on during overdriving. Consequently, the potential on the bit-line in the sense amplifier after the overdrive period may be controlled precisely to the desired array voltage (VARY of FIG. 13). Preferred embodiments of the present invention will now be described with reference to the drawings.

First Embodiment

Figure 1:
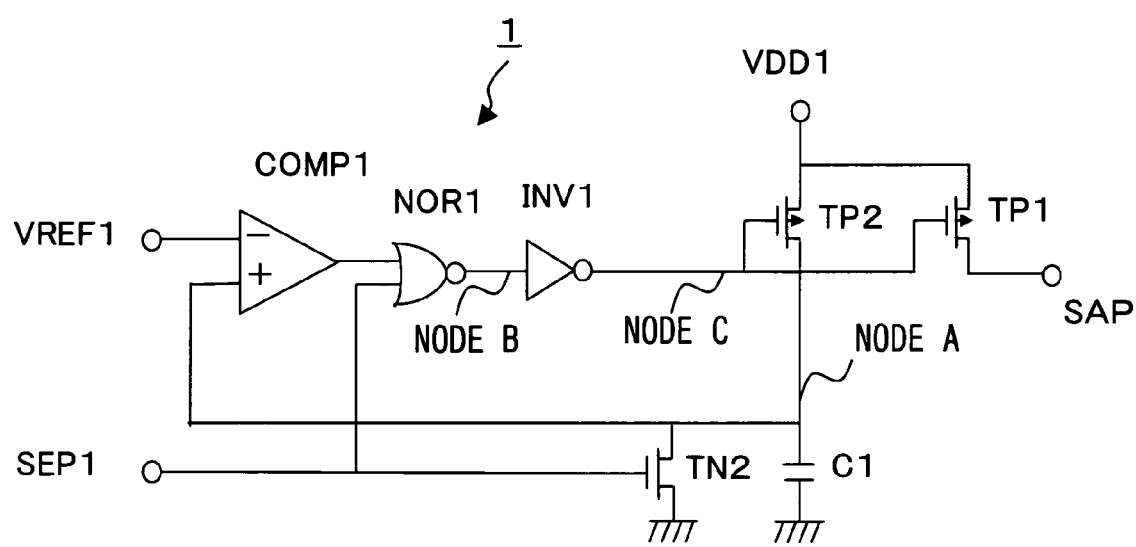
FIG. 1 is a circuit diagram showing the constitution of an overdrive circuit according to a first embodiment of the present invention.

FIG. 1 depicts the constitution of an overdrive circuit according to a first embodiment of the present invention. The overdrive circuit, shown in FIG. 1, is applied to an overdrive circuit 1 in a main part of FIG. 13. Referring to FIG. 1, the overdrive circuit includes a comparator COMP1, a NOR circuit NOR1, an inverter INV1, Pch transistors TP1, TP2, an Nch transistor TN2, and a capacitive device C1. The comparator COMP1 has an inverting input terminal supplied with a reference voltage VREF1, while having a non-inverting input terminal connected to a node A. The NOR circuit NOR1 has an input terminal connected to an output terminal of the comparator COMP1, while having the other input terminal supplied with a control signal SEP1. A node B, which is an output terminal of the NOR circuit NOR1, is connected via inverter INV1 to the gates of the Pch transistors TP1, TP2, as a node C. The sources of the Pch transistors TP1, TP2 are connected to the power supply VDD1. The drain of the Pch transistors TP2 is connected, along with the one end of the capacitive device C1 and the drain of the Nch transistor TN2, to the node A. The other end of the capacitive device C1 and the source of the Nch transistor TN2 are grounded. The gate of the Nch transistor TN2 is supplied with a control signal SEP1. The drain of the Pch transistors TP1 is connected, as an output, to the node SAP of FIG. 13.

In the overdrive circuit 1 of the above constitution, a reference voltage VREF1 is a reference voltage of a constant voltage, for example, an array voltage VARY. In this case, VARY=VREF1. The comparator COMP1 compares the potential of the node A to the reference voltage VREF1. If the potential of the node A is the lower, the comparator COMP1 outputs a low level (VSS). If the potential of the node A is the higher, the comparator outputs a high level (VDD).

Figure 2:
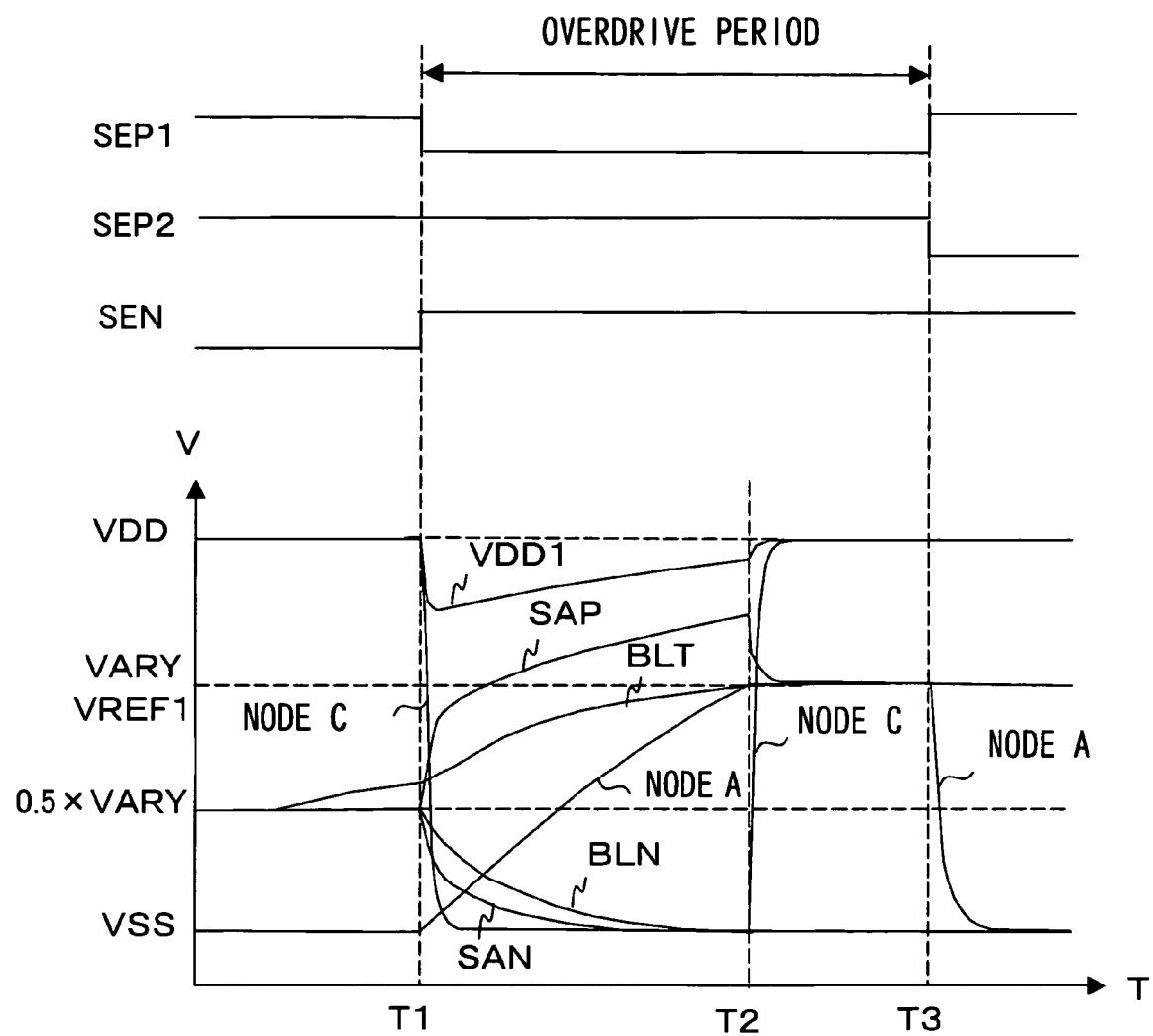
FIG. 2 is a timing chart showing operating waveforms in the essential portions of a DRAM having the overdrive circuit according to the first embodiment of the present invention.

The operation of essential portions of the DRAM, having the above-described overdrive circuit, will now be described. FIG. 2 is a timing chart showing the operating waveforms at the essential parts of the DRAM having the overdrive circuit of FIG. 1.

Referring to FIG. 2, during the time before timing T1, the control signal SEP1 is HIGH, so that the Nch transistor TN2 is turned on. The node A is at a ground voltage (VSS). On the other hand, the node C is HIGH, so that the Pch transistors TP1, TP2 are turned off.

When the control signal SEP1 becomes LOW at timing T1, the node B goes HIGH, because the output of the comparator COMP1 is LOW. The node C becomes LOW, and hence the Pch transistors TP1, TP2 are turned on. As a result, the node SAP is driven by the Pch transistor TP1, so that the bitline BLT is sensed to a high voltage.

On the other hand, the capacitive device C1 is charged by the Pch transistor TP2, which has been turned on, and hence the potential of the node A increases. At timing T2 when the potential at the node A reaches the reference voltage VREF1, an output of the comparator COMP1 is changed over to a HIGH level. Responsive thereto, the node C becomes HIGH to turn off the Pch transistor TP2. Simultaneously, the Pch transistor TP1 is also turned off to halt the driving of the node SAP. Hence, during the time from timing T2 to timing T3, the potential of the bitline BLT is maintained at a constant level. The constant-level potential of the bitline BLT may be made equal to the level of the array voltage VARY by properly setting the sizes of the Pch transistor TP2 and the capacitive device C1, for example.

The proper sizes of the Pch transistor TP2 and the capacitive device C1 may be set in the following manner. Assume that the size of the Pch transistor TP2 is equal to 1/M times that of the Pch transistor TP1, the following equation (2) is derived:

$$\text{Size of } TP2 = \text{size of } TP1 \times 1/M \tag{2}$$

During the period from timing T1 until timing T2, the gate-to-source voltage VGS of the Pch transistor TP1 and that of the Pch transistor TP2 are equal to each other and equal to VDD1-VSS. If the operating point is in a saturation region, as in FIG. 16, the drain current |IDS| is not seriously affected by the difference in the values of the drain-to-source voltage |VDS|. In actuality, when the operating points of the Pch transistors TP1, TP2 are in a saturation region, the value of the electrical charges supplied by the Pch transistor TP1 is approximately M times the value of the electrical charges supplied by the Pch transistor TP2. (see FIG. 16)

On the other hand, during the period from timing T1 until timing T2, the amount of electrical charges stored in the capacitive device C1 is equal to C1×VARY, and is coincident with the amount of electrical charges flowing through the Pch transistor TP2. Hence, the electrical charges, supplied by the Pch transistor TP1, may approximately be represented by the following equation (3):

$$\text{Electrical charges supplied by the } Pch \text{ transistor} \\ TP1 = C1 \times VARY \times M \tag{3}$$

If the amount of electrical charges, supplied by the Pch transistor TP1, is made equal to that of the electrical charges QD, the potential of the bitline BLT is raised to just the level of the array voltage VARY. Hence, the following equation (4):

$$QD = CD \times 0.5 \times VARY = C1 \times VARY \times M \tag{4}$$

may be derived from the equations (1) and (4).
Additionally, the following equation (5):

$$CD:C1 = \text{size of } TP1 : 0.5 \times \text{size of } TP2 \tag{5}$$

may be derived from the equations (2) and (4).

Figure 14:
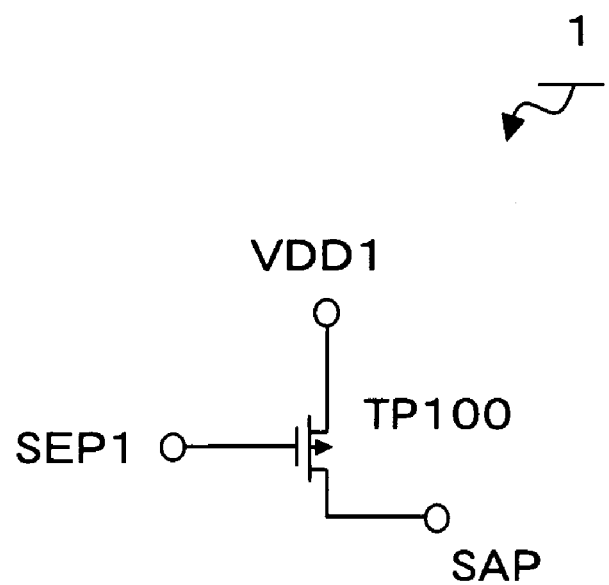
FIG. 14 is a circuit diagram showing the constitution of a conventional typical overdrive system according to the related art.
Figure 15:
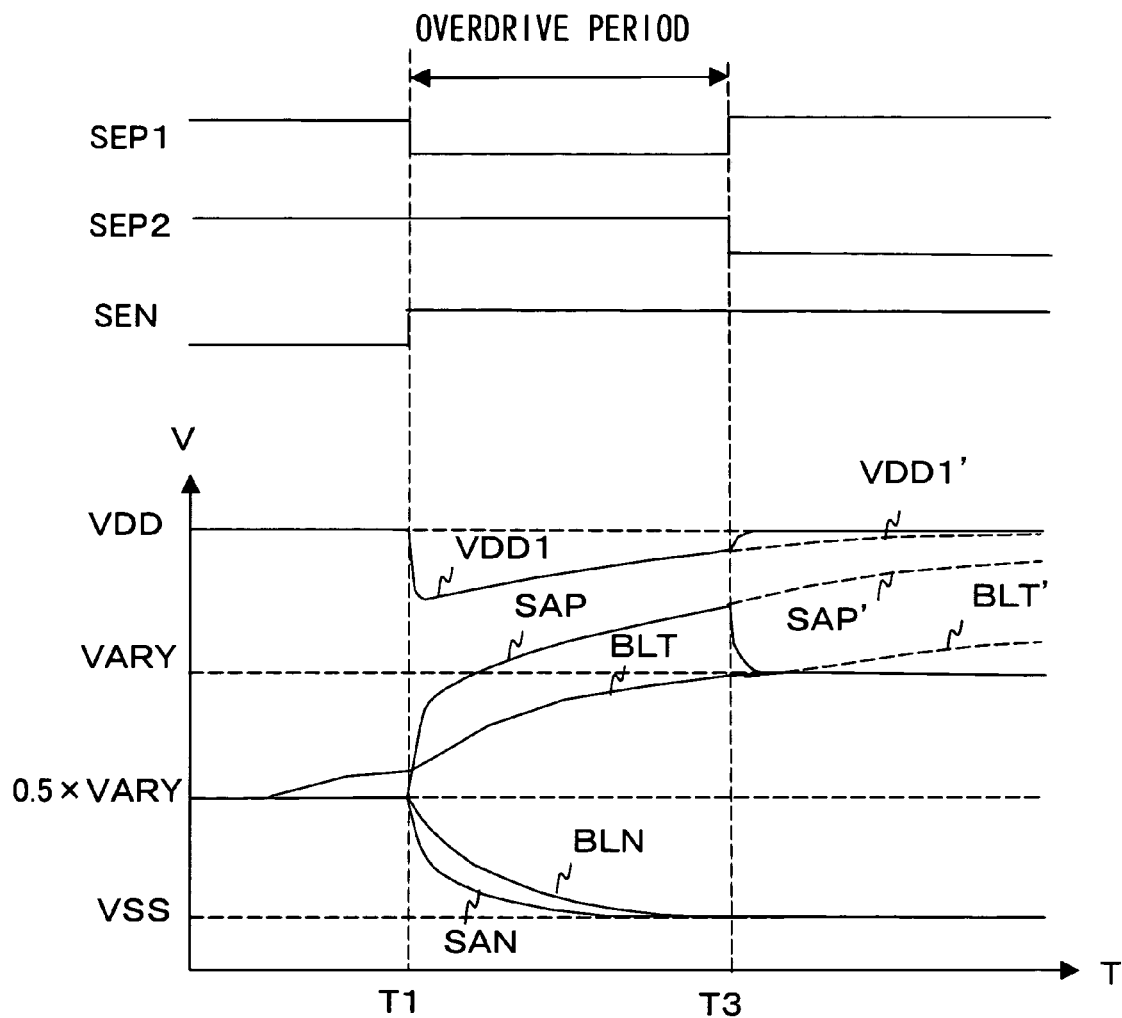
FIG. 15 is a timing chart, analyzed the inventor of the present invention, for showing the operation of essential portions of a DRAM having a sense amplifier of the conventional typical overdrive system according to the related art.

As regards the current consumed during sensing, the current for charging the capacitive device C1 to the level of the array voltage VARY, with the use of the overdrive circuit of FIG. 1, is increased as compared to that with the conventional circuit shown in FIG. 14. Moreover, in using the circuit of the instant embodiment, the layout area is desirably increased by only a small a value. To this end, the capacitance value of the capacitive device C1 or the size of the Pch transistor TP2 is desirably as small as possible. This is made possible if the equation (5) is followed.

It is assumed that the ratio of the capacitance value of the capacitive device C1 to the load capacitance CD is 1/100. If, in such case, the size of the Pch transistor TP2 is set to 1/50 of that of the Pch transistor TP1, in accordance with the equation (5), the potential of the bitline BLT is approximately equal to that of the array voltage VARY at the timing T2 of FIG. 2. If such exemplary value of the above ratio is used, there is scarcely raised a problem even if the current consumption or the layout area is increased from that of the conventional circuit of FIG. 13 due to the use of the overdrive circuit of FIG. 1.

Additionally, the circuit of the instant embodiment is featured by that it is unnecessary to accurately set the overdrive periods itself. Viz., with the setting in accordance with the equation (5), the potential on the bitline BLT is maintained, if it is after timing T2, substantially accurately at a level of the array voltage VARY. Hence, the timing T3 may be set at any time subject to after the timing T2. Thus, even if the delay time of the delay circuitry, used for setting the overdrive period, is fluctuated by various factors, the bitline potential directly after the overdrive period is it the desired potential equal to the array voltage VARY.

Returning to FIG. 2, the control signal SEP1 becomes HIGH at timing T3, and the node A reverts to the LOW level by the Nch transistor TN2 which has been turned on.

With the circuit of FIG. 1, the bitline potential after the overdrive period may accurately be set to the desired value equal to the array voltage, despite variations in the VDD voltage, which thus far posed a problem. That is, the amount of electrical charges, supplied from the Pch transistor TP1, remains substantially constant, in accordance with the equation (3), no matter whether the voltage of the power supply VDD be of higher or lower in value.

Moreover, the bitline potential after the overdrive period may accurately be set to the desired value equal to the array voltage, despite process-related variations in the transistor characteristics. That is, even if the characteristics of the Pch transistors TP1, TP2 are varied due to process-related variations, the transistor characteristics are varied in similar manner, and hence the electrical charges, supplied from the Pch transistor TP1, remain substantially constant.

Moreover, the bitline potential after the overdrive period may accurately be set to the desired value equal to the array voltage, despite process-related variations in the transistor characteristics. That is, even if the characteristics of the Pch transistors TP1, TP2 are varied due to temperature variations, the transistor characteristics are varied in similar manner, and hence the electrical charges, supplied from the Pch transistor TP1, remain substantially constant.

Additionally, the bitline potential after the overdrive period may accurately be set to the desired value equal to the array voltage, despite the wiring resistance dependency of the power supply VDD. That is, if the wiring resistance R is varied to cause variations in the voltage level of the power supply VDD1 of FIG. 2, the electrical charges, supplied from the Pch transistor TP1, remain subsequently constant.

Furthermore, the bitline potential after the overdrive period may accurately be set to the desired value equal to the array voltage, even if different numbers of the sub-arrays are activated for write/readout or for refresh. That is, even if the current flowing through the wiring resistance R and hence the voltage level of the power supply VDD1 are varied, the amount of the electrical charges, supplied from the Pch transistor TP1, remains subsequently constant.

Meanwhile, the timing T3 is to be set so that the timing T3 is necessarily later than the timing T2, taking into account the variations in the delay circuit and the timing T2 caused by one or more of the above factors.

Second Embodiment

Figure 3:
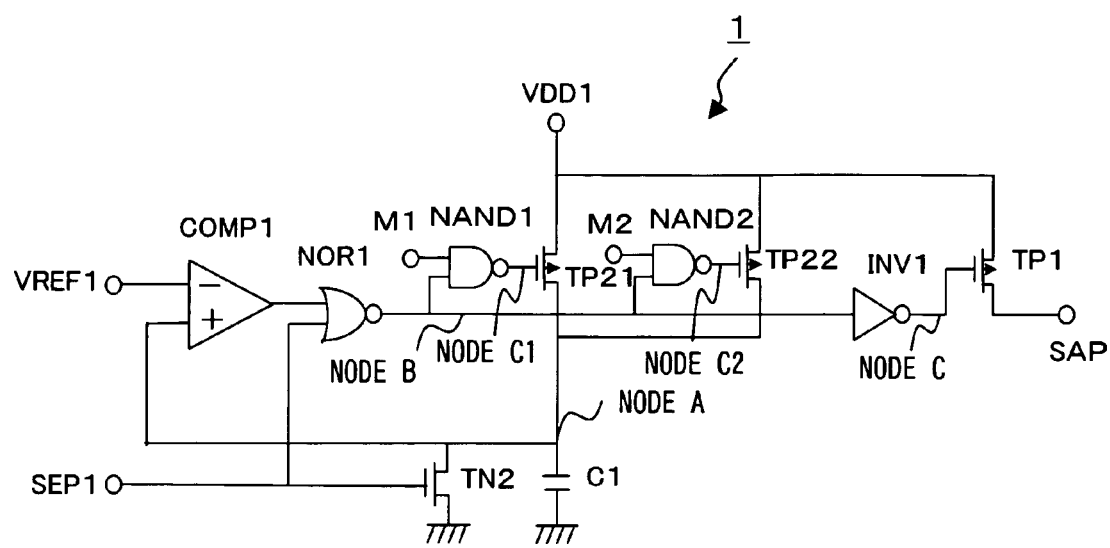
FIG. 3 is a circuit diagram showing the constitution of an overdrive circuit according to a second embodiment of the present invention.

FIG. 3 is a circuit diagram showing the constitution of an overdrive circuit according to a second embodiment of the present invention. In FIG. 3, the same reference numerals as those used in FIG. 1 denote the same parts or components and the description for these parts or components is dispensed with. In the overdrive circuit of FIG. 3, two Pch transistors TP21 and TP22 are used in place of the Pch transistor TP2 in FIG. 1. In effect, the Pch transistor TP2 in FIG. 1 is divided into two and arranged as the Pch transistors TP21 and TP22. The overdrive circuit also includes NAND circuits NAND1, NAND2. Each one of input termials of the NAND circuits NAND1 and NAND2 is connected to a node B. The other input ends of the NAND circuits NAND1 and NAND2 are supplied with control signals M1, M2, respectively. Output terminals of the NAND circuits NAND1 and NAND2 are connected to gates of the Pch transistors TP21 and TP22, respectively. The sources and the drains of the Pch transistor TP21, TP22 are connected common to the power supply VDD1 and connected common to the node A, respectively.

The control signals M1, M2 are controlled by fuses or for test modes etc. Specifically, the size of the transistor TP2 (of FIG. 1), thus, the size ratio M (relative to TP1), is made adjustable by turning the two Pch transistors TP21, TP22 on or off. Although only two Pch transistors, that may be adjusted, are shown, it is of course possible to make more intricate adjustment by providing larger numbers of Pch transistors, for example.

Figure 13:
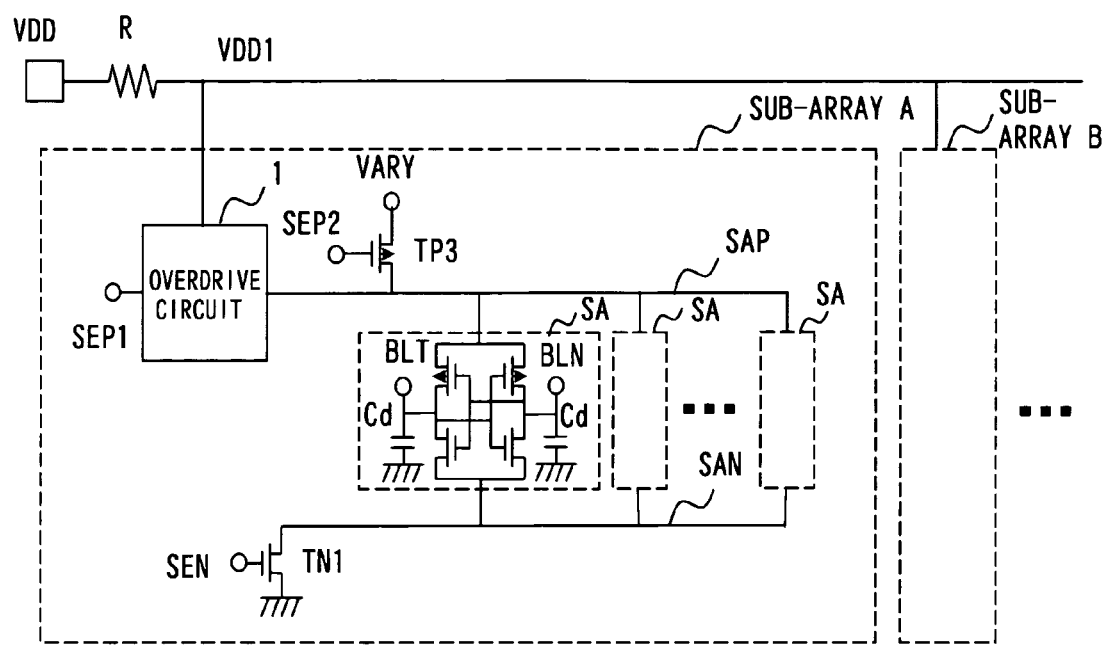
FIG. 13 is a circuit diagram showing essential portions of a DRAM having a sense amplifier of a conventional typical overdrive system according to the related art.

The bitline capacitance Cd of FIG. 13 is fluctuated from process to process. That is, the bitline potential after the overdrive period may be adjusted precisely to the desired array voltage, without dependency on process fluctuations of the bitline capacitance Cd, by matching the size ratio M to a value in meeting with the load capacitance CD, in accordance with the equation (5). Meanwhile, similar adjustment may also be made by the capacitance value of the capacitive device C1 or the size of the Pch transistor TP1.

Third Embodiment

Figure 4:
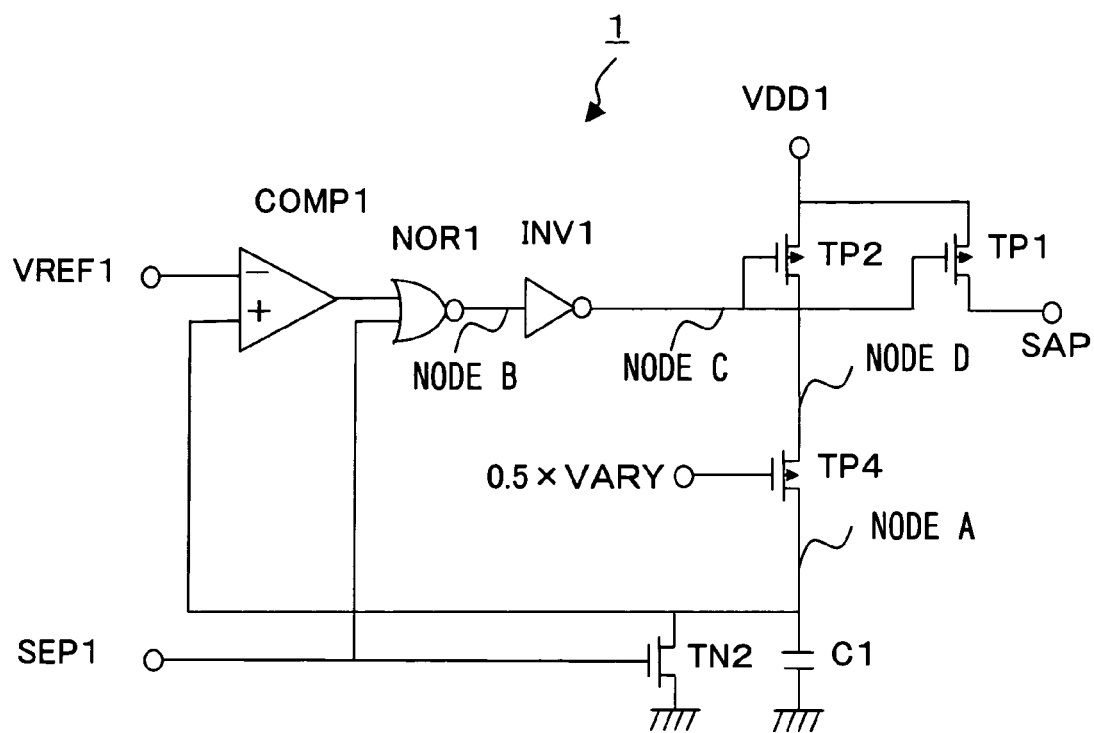
FIG. 4 is a circuit diagram showing the constitution of an overdrive circuit according to a third embodiment of the present invention.

FIG. 4 depicts a circuit diagram showing the constitution of the overdrive circuit according to a third embodiment of the present invention. In FIG. 4, the same reference numerals as those used in FIG. 1 denote the same parts or components and the description for these parts or components is dispensed with. In the overdrive circuit of FIG. 4, a Pch transistor TP4 is provided between the drain of the Pch transistor TP2 and the node A in FIG. 1. A preset correction voltage, such as 0.5×VARY, is transmitted to the gate of the Pch transistor TP4.

Figure 16:
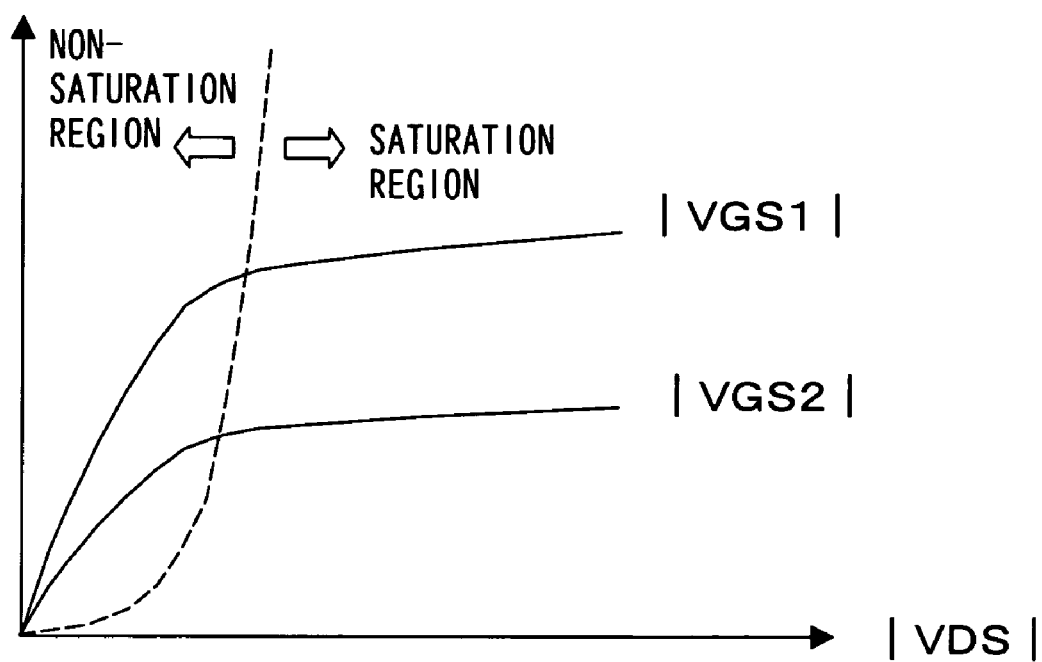
FIG. 16 shows voltage current characteristics of a routine Pch transistor according to the related art.

In the first embodiment, the drain-to-source voltage |VDS| of the Pch transistor TP1 during the period from timing T1 to timing T2 of FIG. 2 is the voltage across VDD1 and SAP, while the drain-to-source voltage |VDS| of the Pch transistor TP2 during the same period is the voltage across VDD1 and node A. The gate-to-source voltage |VGS| of the Pch transistors TP1 and that of the Pch transistors TP2 are equal to each other and equal to VDD1-VSS. Referring to FIG. 16, the two Pch transistors are used in the saturation region as described above. However, the drain currents |IDS| of the two transistors differ slightly due to the difference in the values of the drain-to-source voltage |VDS|. Hence, during the period from timing T1 to timing T2, the ratio between the electrical charges supplied by the Pch transistor TP2 and those supplied by the Pch transistor TP1 is not strictly coincident with the size ratio M between the two Pch transistors TP1, TP2. The value of the non-coincidence represents an error of the potential level of the bitline BLT after the overdrive period with respect to the array voltage VARY.

With the overdrive circuit, shown in FIG. 4, it is possible to reduce this error. The voltage at a node D, that is, at the source of a Pch transistor TP4, is higher than 0.5×VARY by a value equal to the absolute value |VTP| of the threshold voltage of the Pch transistor TP4. The threshold voltage |VTP| is usually on the order of 0.6V. Assume VARY=1.2V, as an example, 0.5×VARY=0.6V holds, so that, during the period from timing T1 to T2, the node D is approximately at 1.2V.

During the period from timing T1 to T2, the level of the node SAP is roughly in the vicinity of 1.2V. Thus, by using the circuit configuration of FIG. 4, the difference in the drain-to-source voltage |VDS| for the Pch transistors TP1, TP2 in the circuit configuration of FIG. 4 becomes smaller than that in the circuit configuration of FIG. 1. Hence, the error of the potential level on the bitline BLT after the overdrive period with respect to the array voltage VARY may be made correspondingly smaller.

Fourth Embodiment

Figure 5:
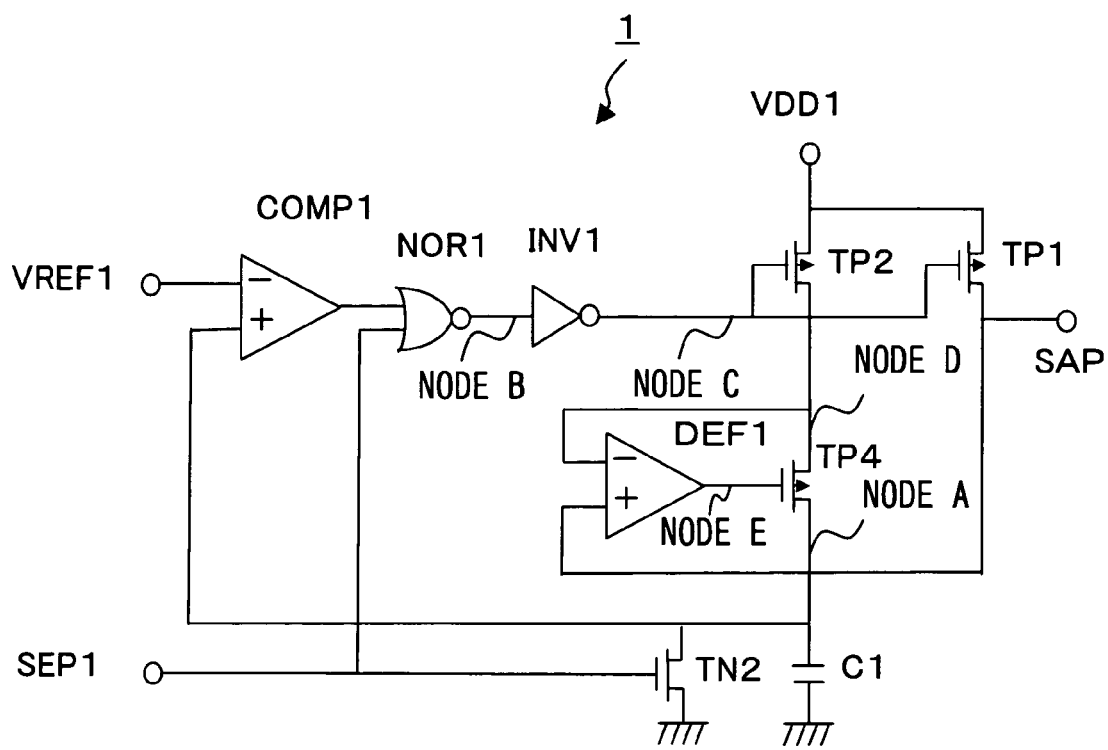
FIG. 5 is a circuit diagram showing the constitution of an overdrive circuit according to a fourth embodiment of the present invention.

FIG. 5 is a circuit diagram showing the constitution of the overdrive circuit according to a fourth embodiment of the present invention. In FIG. 5, the same reference numerals as those used in FIG. 4 denote the same parts or components and the description for these parts or components is dispensed with. In the overdrive circuit of FIG. 5, a differential amplifier DEF1 is added to the circuit of FIG. 4, and the Pch transistor TP4 is driven by the differential amplifier DEF1.

The differential amplifier DEF1 has an inverting input terminal connected to the node D, while having a non-inverting input terminal connected to the drain of the Pch transistor TP1 and having an output terminal connected to the gate of the Pch transistor TP4.

The overdrive circuit of FIG. 5 is controlled by the differential amplifier DEF1 so that the voltage level at the node SAP will be the same as that of the node D. The result is that the Pch transistors TP1, TP2 operate with the same drain-to-source voltage |VDS| during the time T1-T2, and hence the ratio between the amount of electrical charges supplied by the Pch transistor TP2 and that supplied by the Pch transistor TP1 coincides more precisely with the size ratio M between the two Pch transistors TP1, TP2. Consequently, the potential level following the overdrive period may be matched more precisely to the array voltage VARY.

Fifth Embodiment

Figure 6:
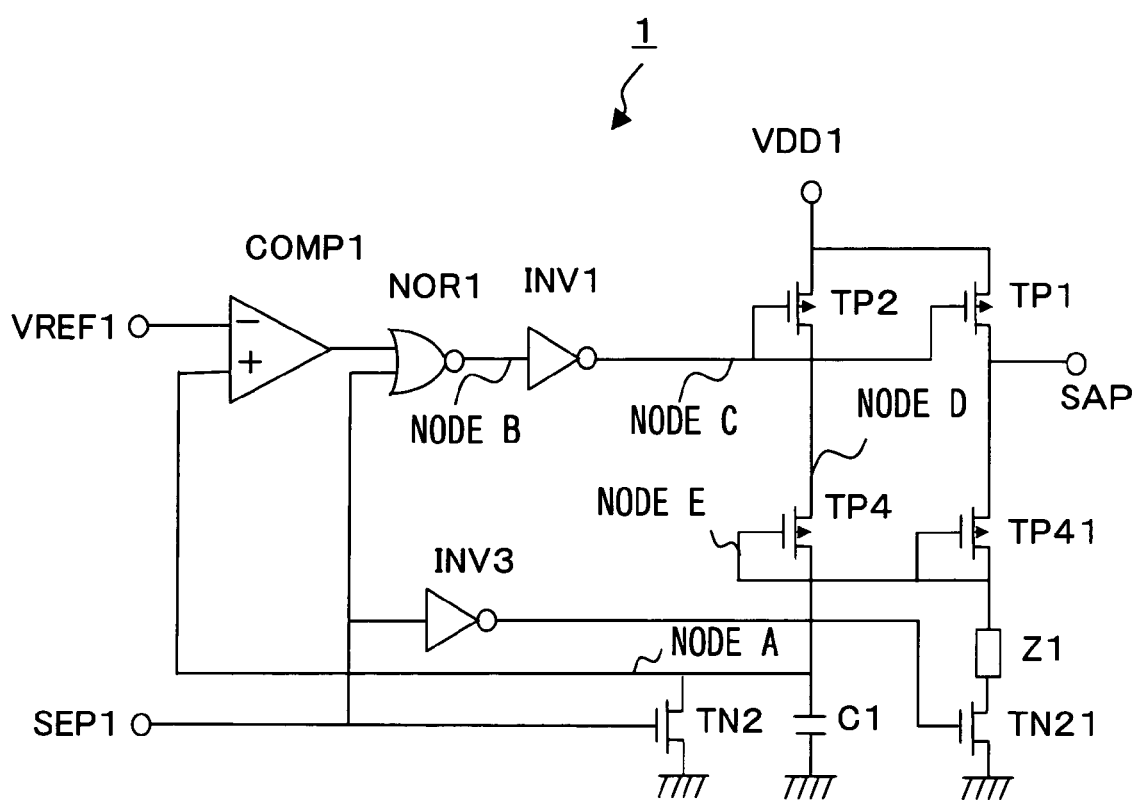
FIG. 6 is a circuit diagram showing the constitution of an overdrive circuit according to a fifth embodiment of the present invention.

FIG. 6 is a circuit diagram showing the constitution of the overdrive circuit according to a fifth embodiment of the present invention. In FIG. 6, the same reference numerals as those used in FIG. 5 denote the same parts or components and the description for these parts or components is dispensed with. In the overdrive circuit of FIG. 6, a Pch transistor TP41, an inverter INV3, an Nch transistor TN21 and an impedance device Z1 are arranged in place of the differential amplifier DEF1 in FIG. 5. The Pch transistor TP41 has a source connected to the node SAP, while having a gate and a drain connected to the node E. The inverter INV3 is supplied with the control signal SEP1, and has an output connected to the gate of the Nch transistor TN21. The Nch transistor TN21 has a source grounded, while having a drain connected to one terminal of the impedance device Z1. The other terminal of the impedance device Z1 is connected to the node E. The impedance device Z1 may be a current limiting element for limiting the current to a moderately low current, and may, for example, be a resistor. The impedance device may also be an Nch transistor, the gate of which is supplied with a voltage of a suitable value and which is elongated in channel length.

Figure 7:
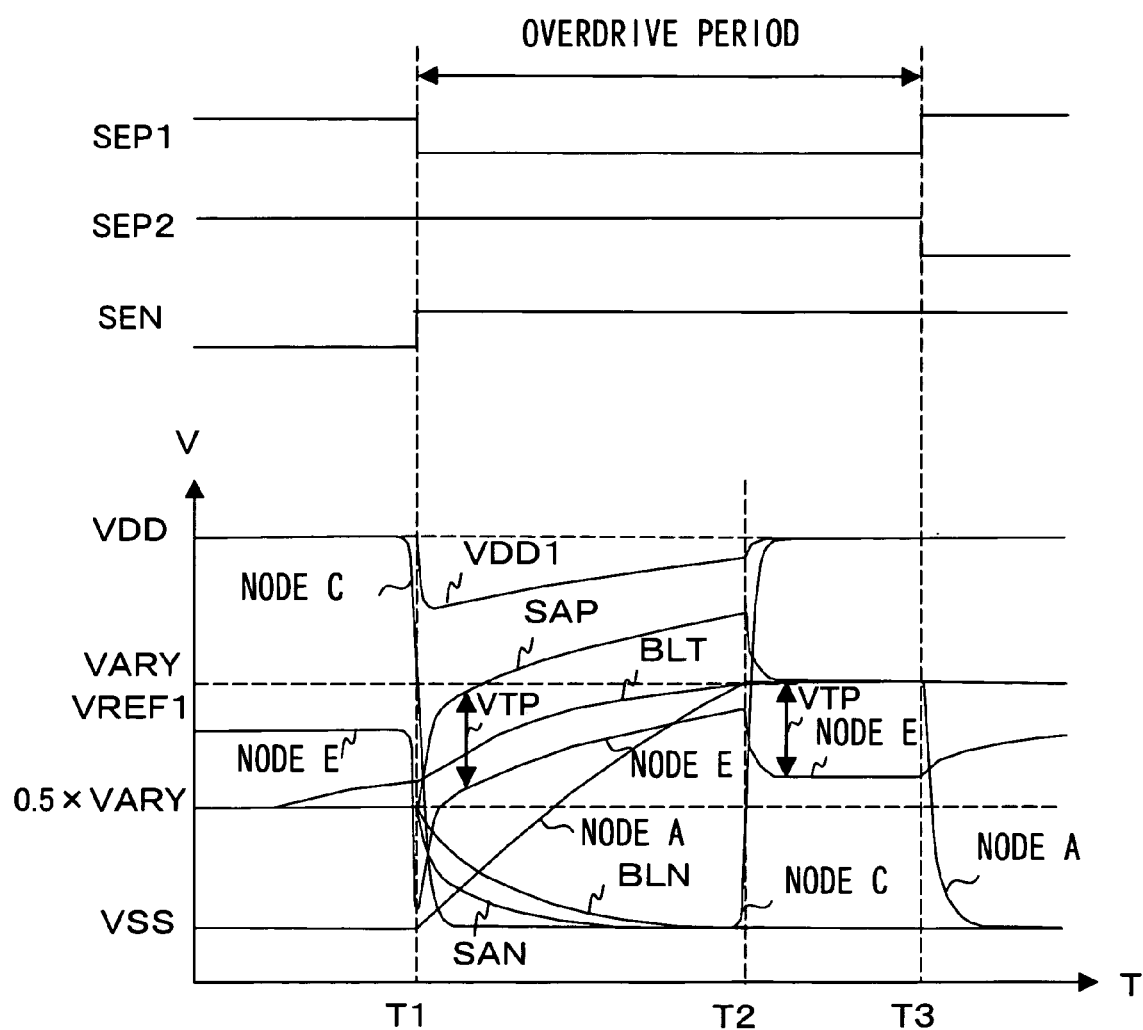
FIG. 7 is a timing chart showing operating waveforms in the essential portions of the DRAM having the overdrive circuit according to the fifth embodiment of the present invention.

FIG. 7 is a timing chart showing the operating waveform in the essential part of the DRAM including the overdrive circuit of FIG. 6. In FIG. 7, the same reference numerals as those of FIG. 2 denote the operating waveforms of the same nodal points and the corresponding description is dispensed with. When the node SEP1 is changed at timing T1 from HIGH to LOW, the Nch transistor TN21 is changed over from off to on.

During the period from timing T1 to timing T3, a moderately low current, limited by the impedance device Z1, flows from the node SAP to the ground through the Pch transistor TP41, impedance device Z1 and the Nch transistor TN21. Since the gate and the drain of the Pch transistor TP41 are connected to each other, the voltage level of the node E is maintained at a value lower than a voltage at the node SAP by a value equal to an absolute value |VTP| of a threshold voltage of the Pch transistor TP41. On the other hand, the voltage at the node D is maintained at a value lower than the voltage at the node E by a value equal to an absolute value |VTP| of a threshold voltage of the Pch transistor TP4. Consequently, the node D is maintained at all times at the same level as the voltage at the node SAP. The result is that, during the period from timing T1 to timing T2, the Pch transistors TP1, TP2 are driven at the same drain-to-source voltage |VDS| and hence the ratio of the amount of electrical charges supplied by the Pch transistor TP2 and that supplied by Pch transistor TP1 is precisely coincident with the size ratio M of the Pch transistors TP1, TP2.

It is noted that, in the present embodiment, part of the electrical charges supplied by the Pch transistor TP1 flows from the node SAP to the ground. The current flowing from the node SAP to the ground, if sufficiently small, is able to precisely control the voltage at the node D to the same level as the voltage at the node SAP. Consequently, the voltage level on the bitline BLT as from the timing T2 is scarcely affected, while increase in the current consumption hardly poses a problem.

As from timing T3, the control signal SEP1 becomes HIGH to turn off the Nch transistor TN21 to cut off the wasteful current otherwise flowing from the node SAP to the ground.

In the present embodiment, described above, the potential level of the bitline BLT after the overdrive period may be matched precisely to the array voltage VARY, as in the fourth embodiment, described above, despite the circuit configuration simpler than that used in the fourth embodiment.

Sixth Embodiment

Figure 8:
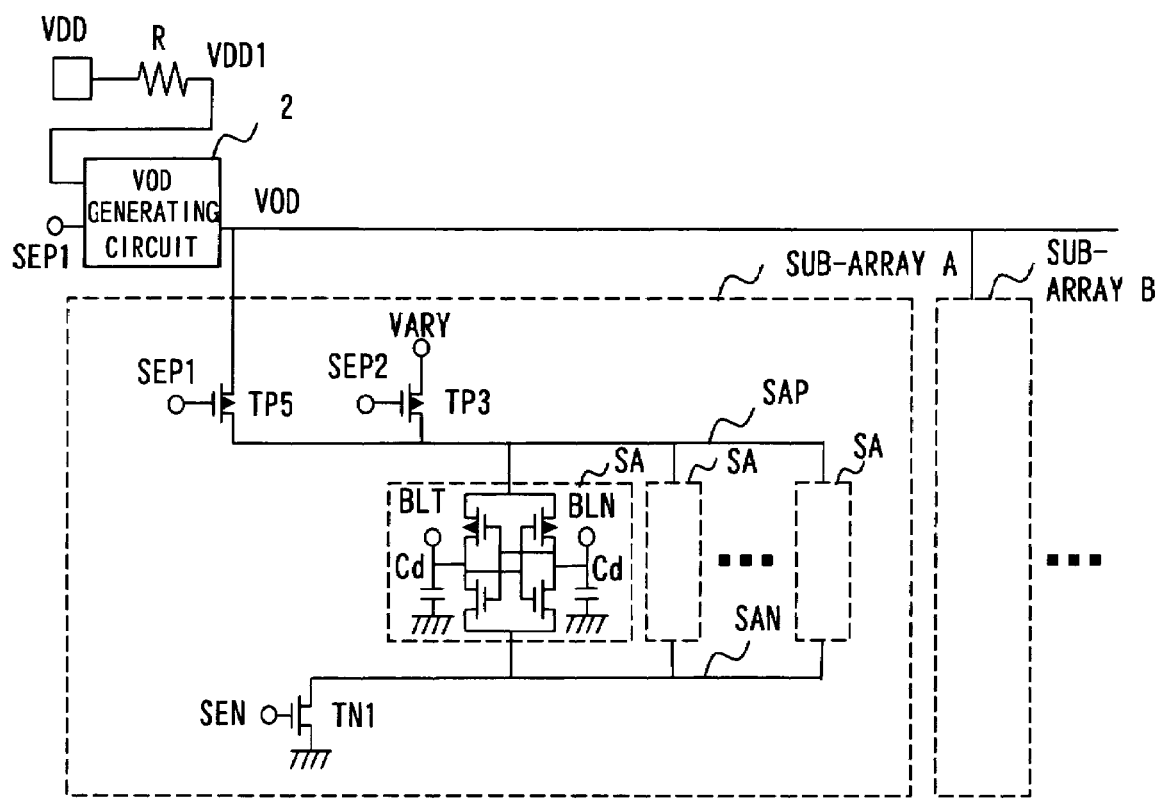
FIG. 8 is a circuit diagram showing essential portions of a DRAM having a sense amplifier of the overdrive system according to a sixth embodiment of the present invention.

FIG. 8 depicts a circuit diagram showing essential parts of a DRAM having sense amplifiers based on the overdrive system according to a sixth embodiment of the present invention. In FIG. 8, the same reference numerals as those of FIG. 13 denote the same parts or components and the corresponding description is dispensed with. FIG. 8 differs from FIG. 13 in that a VOD generating circuit 2 is provided, and in that a Pch transistor TP5 is provided in place of the overdrive circuit 1 in FIG. 13. The VOD generating circuit 2 is controlled by the control signal SEP1 and supplies the voltage of the power supply VDD1 to a node VOD. The Pch transistor TP5 has a source connected to the node VOD, as an output of the VOD generating circuit 2, while having a drain connected to the node SAP and having a gate supplied with the control signal SEP1.

Figure 9:
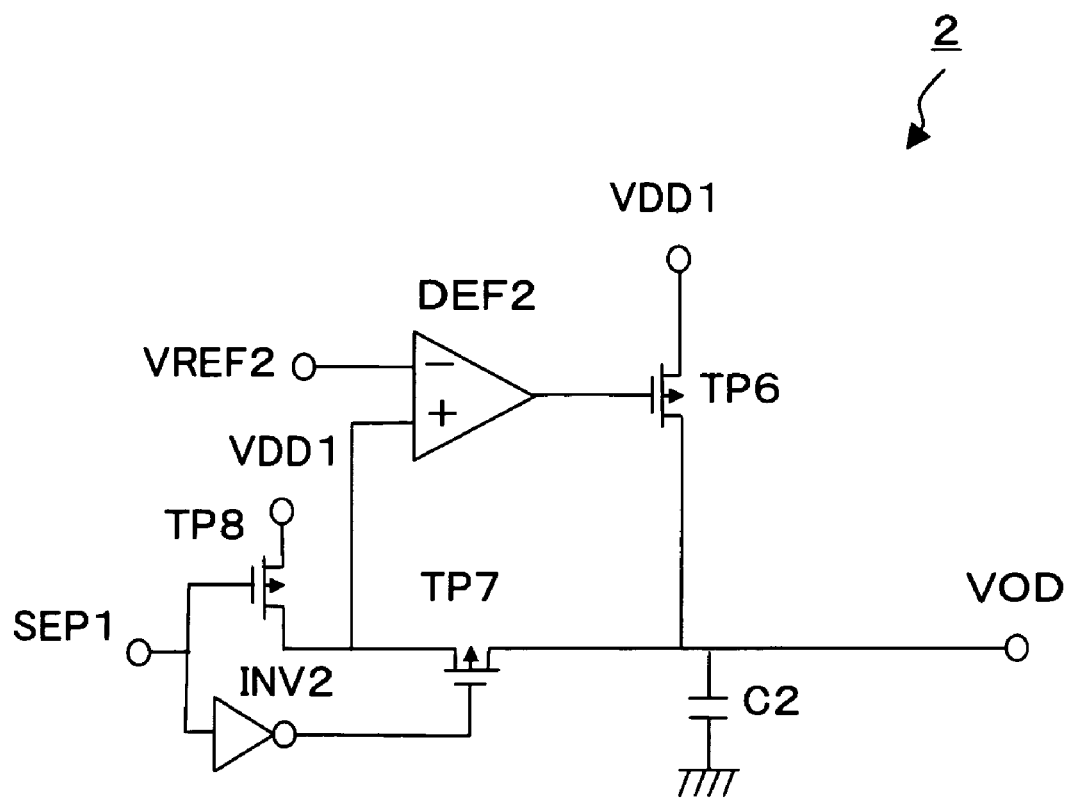
FIG. 9 is a circuit diagram showing the constitution of a VOD generating circuit according to the sixth embodiment of the present invention.

FIG. 9 depicts a circuit diagram showing the constitution of the VOD generating circuit 2. In FIG. 9, the VOD generating circuit 2 includes a differential amplifier DEF2, an inverter INV2, Pch transistors TP6, TP7 and TP8 and a capacitive device C2. The control signal SEP1 is transmitted to the gate of the PC transistor TP8 and inverted by the inverter INV2 so as to be supplied to the gate of the Pch transistor TP7. The Pch transistor TP8 has a source connected to the power supply VDD1. The drain of the Pch transistor TP8 and the source of the Pch transistor TP7 are connected common to the non-inverting terminal of the differential amplifier DEF2. The differential amplifier DEF2 has an inverting terminal supplied with the reference voltage VREF2 and has an output terminal connected to the gate of the Pch transistor TP6. The Pch transistor TP6 has a source connected to VDD1, while having a drain connected, in common with the drain of the Pch transistor TP7, to the node VOD. The capacitive device C2 is connected between the node VOD and the ground.

Figure 10:
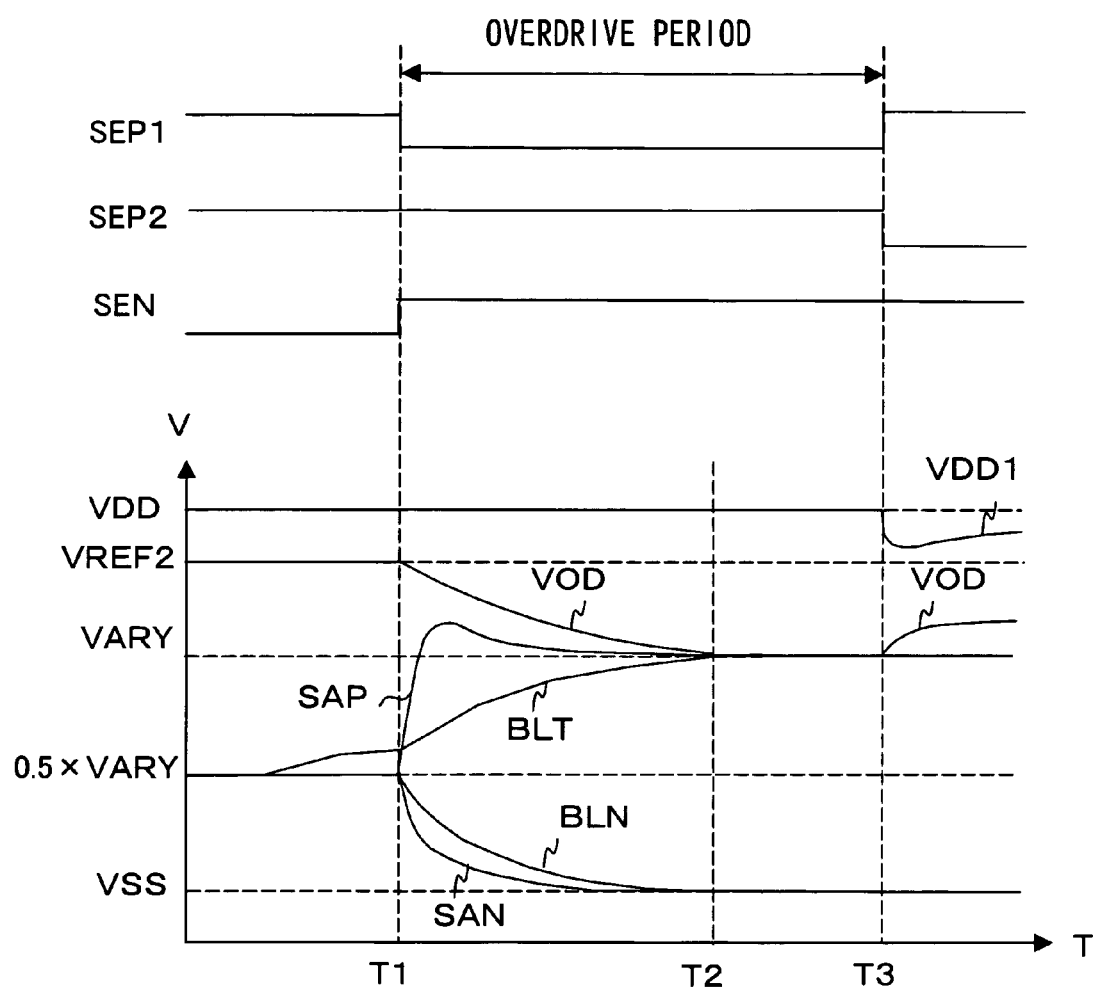
FIG. 10 is a timing chart showing operating waveforms in the essential portions of a DRAM having the VOD generating circuit according to the sixth embodiment of the present invention.

The operation of the essential portions of the DRAM, having the VOD generating circuit, described above, will now be described. FIG. 10 depicts a waveform diagram showing the operations of the various parts in FIGS. 8 and 9. Before timing T1, the control signal SEP1 is HIGH, while the Pch transistor TP8 is off. The Pch transistor TP7, the gate of which has become LOW, is turned on, and the node VOD is coupled to the non-inverting terminal of the differential amplifier DEF2. To an inverting terminal of the differential amplifier DEF2 is supplied the reference voltage VREF2 as a voltage reference for the node VOD. Thus, the potential at the node VOD is at the same potential as the reference voltage VREF2 via Pch transistor TP6. The potential at the node VOD is stored in the capacitive device C2.

When the control signal SEP1 becomes LOW at timing T1, the Pch transistor TP7 is turned off, while the Pch transistor TP8 is turned on. The output of the differential amplifier DEF2 becomes HIGH (VDD), and the Pch transistor TP6 is turned off. At this time, the node VOD tends to hold the potential by the capacitive device C2. Simultaneously, the Pch transistor TP5 is turned on so that the node SAP is driven from the node VOD. That is, the node SAP is driven by the electrical charges stored in the capacitive device C2.

The bitline BLT, node SAP and the node VOD are connected common via Pch transistor TP5 and sense amplifier SA, and hence converge towards the same potential to reach this same potential at timing T2. This potential may be set to the array voltage VARY by setting the capacitance of the capacitive device C2 to a proper value. This proper capacitance value may be set in the following manner.

If the electrical charges QD in accordance with the equation (1) are supplied from the Pch transistor TP5, the voltage level at the node VOD becomes equal to the level of the array voltage VARY. Thus, the following equation (6) may be derived:

$$QD = C2 \times (VREF2 - VARY) = CD \times 0.5 \times VARY \qquad (6)$$

Hence, the capacitance of the capacitive device C2 may be set as indicated by the following equation (7):

$$C2 = CD \times 0.5 \times VARY / (VREF2 - VARY) \qquad (7)$$

For example, if VARY=1.2V and VREF2=1.6V, C2=1.5× CD.

With the setting in accordance with the equation (7), the potential on the bitline BLT as from timing T2 becomes equal to the array voltage VARY. Hence, the timing T3 may be set at any time as from timing T2. Thus, with the present sixth embodiment, it is unnecessary to make accurate setting of the overdrive period. Moreover, similarly to the first embodiment, the present sixth embodiment is not susceptible to the various factors of variations, such as power supply VDD.

At timing T3, the Pch transistors TP8 and TP7 are turned off and on, respectively, at the same time as the control signal SEP1 becomes HIGH, and the Pch transistors TP5 is turned off. Thus, the node VOD begins to be charged, that is, the capacitive device C2 begins to be charged, towards the power supply VDD1, by the differential amplifier DEF2 and the Pch transistors TP6.

As for the charging of the capacitive device C2, it is sufficient that the capacitive device C2 has been charged to the voltage of the reference voltage VREF2 before the sensing is commenced during the next cycle, that is, before the timing T1 of the next cycle. It is therefore sufficient that the charging of the capacitive device C2 proceeds slowly, and hence it is sufficient to use a small-sized transistor as the Pch transistors TP6. Moreover, the peak current flowing through the wiring resistance R of the power supply VDD is decreased to reduce the sagging of the voltage of the power supply VDD1. That is, the power supply noise may be reduced.

Seventh Embodiment

Figure 11:
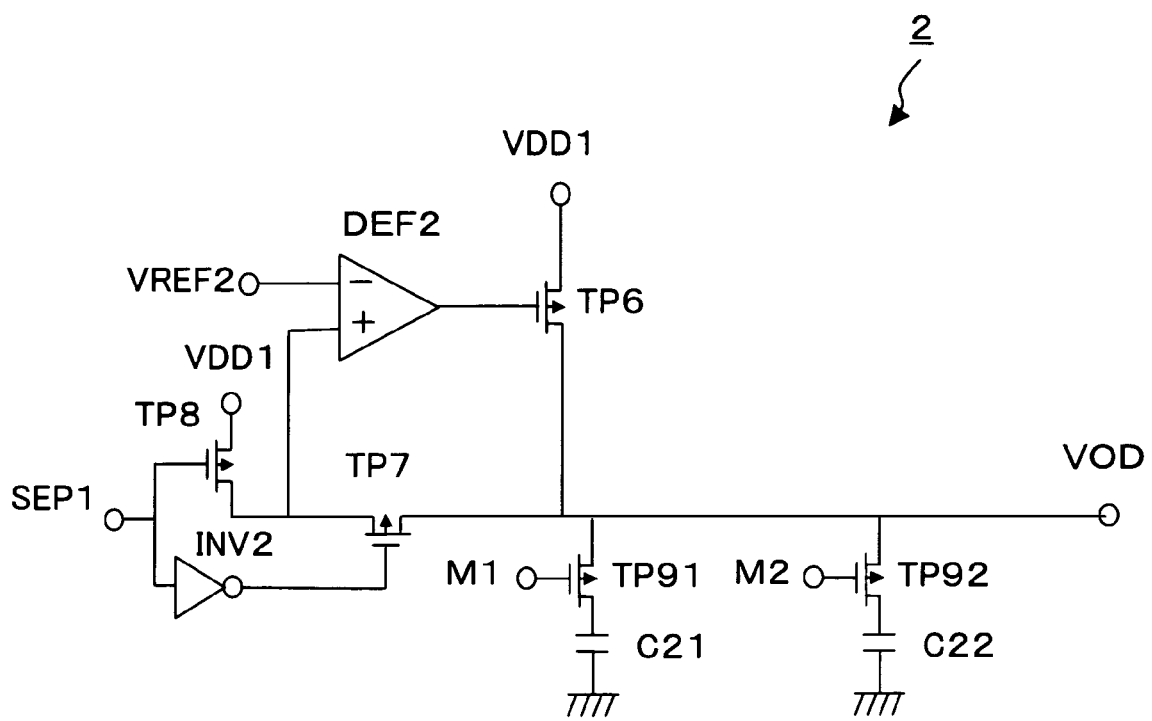
FIG. 11 is a circuit diagram showing the constitution of a VOD generating circuit according to a seventh embodiment of the present invention.

FIG. 11 is a circuit diagram showing a VOD generating circuit 2 according to a seventh embodiment of the present invention. In FIG. 11, the same reference numerals as those used in FIG. 9 denote the same parts or components and the description for these parts or components is dispensed with. In the VOD generating circuit of FIG. 11, two capacitive devices C21, C22 are used in place of the capacitive device C2 of the VOD generating circuit of FIG. 9. That is, the capacitive device C2 of FIG. 9 is, as it were, split into the two capacitive devices C21, C22. Moreover, Pch transistors TP91, TP92, as switching devices, are provided between the node VOD and the capacitive devices C21, C22, respectively. The Pch transistors TP91, TP92 are turned on or off by fuses or control signals M1, M2, respectively, as set in, e.g., a test mode. That is, the capacitance of the capacitive device C2 in FIG. 9 is made adjustable by control signals.

The bitline capacitances Cd are fluctuated during the manufacture process. Thus, by adjusting the capacitance of the capacitive device C2 to the size ratio M, suited to the value of the load capacitance CD, in accordance with the equation (7), by the control signals, the bitline potential following the overdrive period may precisely be set to the desired array voltage, without dependency on the process-related variations of the bitline capacitances Cd. In the present embodiment, only two capacitive devices for adjustment are shown. However, it is of course possible to provide larger numbers of the capacitive devices to provide for more intricate adjustment.

In case different numbers of the sub-arrays are to be activated, such as during write, readout or refresh, the potential on the bitline following the overdrive period may be precisely set to the desired array voltage by adjusting the capacitance of the capacitive device C2, as the occasion may demand. That is, in case the Pch transistors are turned on by the control signals, assuming that the total value of the capacitances electrically coupled to the node VOD is C2A, and the number of the activated sub-arrays is L, it is sufficient to set the value of C2A in accordance with the following equation (8):

$$C2A = L \times CD \times 0.5 \times VARY / (VREF2 - VARY) \qquad (8)$$

Eighth Embodiment

Figure 12:
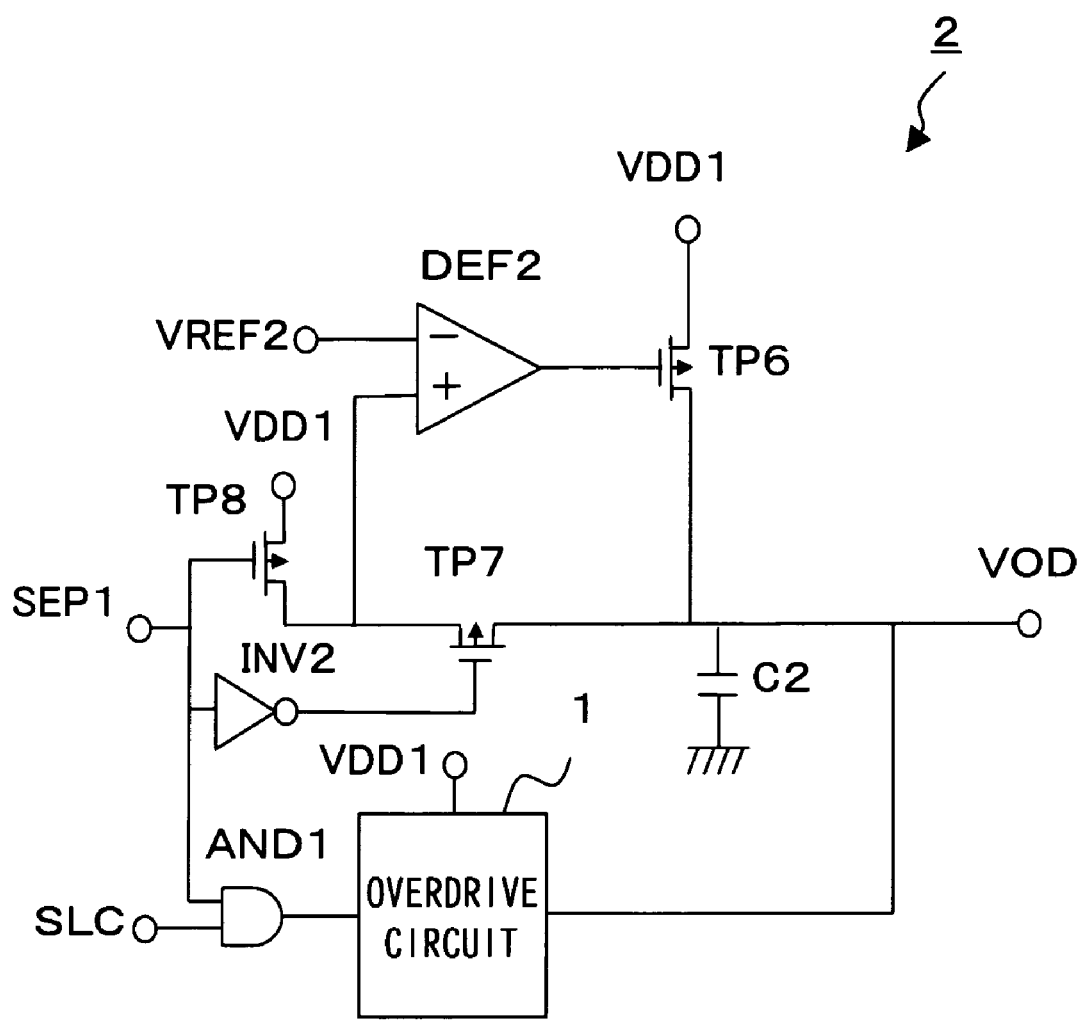
FIG. 12 is a circuit diagram showing the constitution of a VOD generating circuit according to an eighth embodiment of the present invention.

FIG. 12 is a circuit diagram showing a VOD generating circuit according to an eighth embodiment of the present invention. In FIG. 12, the same reference numerals as those used in FIG. 9 denote the same parts or components and the description for these parts or components is dispensed with. In the VOD generating circuit of FIG. 12, an AND circuit AND1 and an overdrive circuit 1 are added to the VOD generating circuit of FIG. 9. The overdrive circuit 1 is a circuit shown in FIG. 1, 3, 4, 5 or 6, and has an output node (junction point to the node SAP shown in FIG. 1, 3, 4, 5 or 6) connected to the node VOD, and the control node (supply junction point of the control signal SEP1 in FIG. 1, 3, 4, 5 or 6) is connected to an output terminal of the AND circuit AND1. The AND circuit AND1 receives a selection signal SLC and the control signal SEP1 and outputs the control signal SEP1 to the overdrive circuit 1 when the selection signal SLC is at a HIGH level. That is, when the selection signal SLC is at a HIGH level, the overdrive circuit 1 and the VOD generating circuit of FIG. 9 are in operation by the control signal SEP1.

In the VOD generating circuit of FIG. 9, it is necessary for the capacitive device C2 to be of an extremely high capacitance value for driving the load capacitance CD of the sub-arrays which are to be activated. Also, in the VOD generating circuit of FIG. 11, it is necessary for the capacitive devices C21, C22 to be of an extremely high capacitance for driving the total load capacitance L×CD of the sub-arrays which are to be activated. Hence, there is fear that the layout area in a chip tends to be increased.

In case the VOD generating circuit is of the circuit configuration shown in FIG. 12, it is possible to reduce the electrical charges, supplied from the capacitive device C2 to the node VOD, in an amount corresponding to the electrical charges supplied from the overdrive circuit 1 to the node VOD during the overdrive period. That is, the layout area for the capacitive device C2 may be reduced by such extent. Moreover, since the current supplied from the power supply VDD for the sensing operation may be distributed over the period from timing T1 to timing T2 extending to the period as from timing T3, it is possible to reduce the peak current and the power supply noise.

It is sufficient that the sizes of the devices of FIG. 12 can be adjusted so that the electrical charges supplied to the node VOD will be equal to QD or L×QD. That is, since the electrical charges supplied from the capacitive device C2 are represented by equation (6), the electrical charges supplied from the overdrive circuit 1 follow equation (4), adjustment may be made as indicated by the following equation (9):

$$QD \text{ or } L \times QD = C2 \times (VREF2 - VARY) + C1 \times VARY \times M \quad (9)$$

Meanwhile, during write/readout when only one sub-array is activated, in the circuit configuration shown in FIGS. 8 or 12, the overdrive circuit 1 may remain inactivated to drive the node VOD solely by the capacitive device C2. During the refresh time, when a plural number of sub-arrays are activated, the overdrive circuit 1 may be activated to drive the node VOD with both the capacitive device C2 and the overdrive circuit 1.

Although the present invention has so far been explained with reference to the preferred embodiments, the present invention is not limited to the particular configurations of these embodiments. It will be appreciated that the present invention may encompass various changes or modifications such as may readily be arrived at by those skilled in the art within the scope and the principle of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory including a plurality of sense amplifiers based on an overdrive system, comprising:
   a first switch device interconnecting said sense amplifiers connected in parallel and a first power supply; said first switch device being on when overdrive begins;
   a capacitive device that accumulates electrical charges referenced to in association with electrical charges supplied via said first switch device to said sense amplifiers;
   a second switch device interconnecting said capacitive device and said first power supply and being turned on when overdrive begins;
   a control circuit that exercises control for turning said first and second switch devices off when the potential of said capacitive device has reached a preset voltage lower than a voltage of said first power supply; and
   a third switch device interconnecting said sense amplifiers and a second power supply having said preset voltage; said third switch device being turned on after said first and second switch devices are turned off to supply said second power supply to said sense amplifiers.

2. The semiconductor memory according to claim 1 wherein said first and second switch devices comprise a first MOS transistor and a second MOS transistor, respectively; a size ratio between said first and second MOS transistors being determined based on a ratio of a total load capacitance to be driven with said first MOS transistor on and a capacitance of said capacitive device.

3. The semiconductor memory according to claim 2 wherein said second MOS transistor is made up of a plurality of MOS transistors which are connected parallel to one another and are controlled on or off, respectively; and
   the effective size of said second MOS transistor is set by on/off control of said a plurality of MOS transistors.

4. The semiconductor memory according to claim 2 wherein said first MOS transistor has a function of setting an effective size of said first MOS transistor based on a control signal.

5. The semiconductor memory according to claim 1 wherein said capacitive device has a function of setting the effective capacitance value thereof by a control signal.

6. The semiconductor memory according to claim 2 further comprising:
   a third MOS transistor connected between said second MOS transistor and said capacitive device;
   said third MOS transistor having a source connected to the drain of said second MOS transistor, having a drain connected to said capacitive device and having a gate supplied with a correction voltage.

7. The semiconductor memory according to claim 6 wherein said correction voltage is one-half said preset voltage.

8. The semiconductor memory according to claim 6 further comprising:
   a differential amplifier having a non-inverting input terminal connected to a junction node interconnecting the drain of said first MOS transistor and said sense amplifiers and having an inverting input terminal connected to a junction node interconnecting the drain of said second MOS transistor and the source of said third MOS transistor; wherein
   an output terminal of said differential amplifier is connected to the gate of said third MOS transistor instead of applying said correction voltage to said gate of said third MOS transistor.

9. The semiconductor memory according to claim 6 further comprising:
   a fourth MOS transistor having a source connected to a junction interconnecting the drain of said first MOS transistor and said sense amplifiers and having a gate and a drain connected together; and
   a circuit composed of a series connection of an impedance device and a fourth switch device; said circuit having one end connected to a junction interconnecting the gate and the drain of said fourth MOS transistor; said circuit having the other end grounded;
   said fourth switch device being on during an overdrive period;

a junction interconnecting the gate and the drain of said fourth MOS transistor being connected to said gate of said third MOS transistor instead of applying said correction voltage to said gate of said third MOS transistor.

10. A semiconductor memory including a plurality of sense amplifiers based on an overdrive system, comprising:
a first capacitive device charged to a potential of a third power supply outside an overdrive period;
a first switch device turned on during said overdrive period for supplying the electrical charges stored in said first capacitive device to a plurality of sense amplifiers connected in parallel with one another; and
a second switch device turned on when the overdrive period ends to supply a second power supply having a potential lower than the potential of said third power supply to said plural sense amplifiers;
the capacitance of said first capacitive device being determined based on a total load capacitance driven with said first switch device on, the potential of said third power supply and the potential of said second power supply.

11. The semiconductor memory according to claim 10 wherein said capacitive device is made up by a circuit composed of a parallel connection of a plurality of cascaded connections each including a MOS transistor that may be turned on or off and a capacitor; and
the effective capacitance of said first capacitive device is determined by on/off control of said MOS transistor.

12. The semiconductor memory according to claim 10 further comprising:
a third switch device interconnecting a first power supply and said third power supply and being turned on when overdriving begins;
a second capacitive device that accumulates electrical charges referenced to in association with electrical charges supplied via said third switch device and said first switch device to said plural sense amplifiers;
a fourth switch device interconnecting said second capacitive device and said first power supply and being turned on when overdriving begins; and
a control circuit that exercises control so that, when a potential of said second capacitive device has reached a potential of said second power supply, said third and fourth switch devices are turned off.

13. The semiconductor memory according to claim 12 wherein
said third and fourth switch devices comprise a first MOS transistor and a second MOS transistor, respectively; and
a size ratio between said first and second MOS transistors is determined based on a ratio between a total load capacitance driven with said first MOS transistor on and a capacitance of said second capacitive device.

14. The semiconductor memory according to claim 13 wherein
said second MOS transistor is made up of a plurality of MOS transistors which are connected in parallel with one another and are controlled to be turned on or off, respectively;
an effective size of said second MOS transistor being set by on/off control of said plural MOS transistors.

15. The semiconductor memory according to claim 13 further comprising:
a third MOS transistor connected between said second MOS transistor and said second capacitive device;
said third MOS transistor having a source connected to the drain of said second MOS transistor, having a drain connected to said second capacitive device and having a gate supplied with a correction voltage.

16. The semiconductor memory according to claim 15 wherein said correction voltage is one-half said preset voltage.

17. The semiconductor memory according to claim 15 further comprising:
a differential amplifier having a non-inverting input terminal connected to a junction point interconnecting the drain of said first MOS transistor and said third power supply and having an inverting input terminal connected to a junction point interconnecting the drain of said second MOS transistor and the source of said third MOS transistor; wherein
an output terminal of said differential amplifier is connected to the gate of said third MOS transistor instead of applying said correction voltage to said gate of said third MOS transistor.

18. The semiconductor memory according to claim 15 further comprising:
a fourth MOS transistor having a source connected to a junction interconnecting the drain of said first MOS transistor and said third power supply and having a gate and a drain connected together; and
a circuit composed of a series connection of an impedance device and a fifth MOS transistor; said circuit having one end connected to a junction interconnecting the gate and the drain of said fourth MOS transistor; said circuit having the other end grounded;
said fifth MOS switch being on during an overdrive period;
a junction interconnecting the gate and the drain of said fourth MOS transistor being connected to the gate of said third MOS transistor, instead of applying said correction voltage to said gate of said third MOS transistor.

* * * * *